(12) United States Patent
Omura et al.

(10) Patent No.: US 7,385,250 B2
(45) Date of Patent: Jun. 10, 2008

(54) SEMICONDUCTOR DEVICE

(75) Inventors: Ichiro Omura, Yokohama (JP); Wataru Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 163 days.

(21) Appl. No.: 11/455,650

(22) Filed: Jun. 20, 2006

(65) Prior Publication Data
US 2006/0289915 A1 Dec. 28, 2006

(30) Foreign Application Priority Data
Jun. 20, 2005 (JP) ............................. 2005-178837

(51) Int. Cl.
*H01L 29/78* (2006.01)
*H01L 23/62* (2006.01)
*H01L 21/332* (2006.01)

(52) U.S. Cl. ............... 257/341; 257/363; 257/492; 257/E29.256; 257/E29.257; 257/E21.382; 438/133

(58) Field of Classification Search .......... 257/341, 257/492, 493, E29.027, E29.066, E29.197, 257/E29.201, E29.256, E29.257, E21.382
See application file for complete search history.

(56) References Cited

U.S. PATENT DOCUMENTS 5,557,121 A * 9/1996 Kozuka et al. ............ 257/292
2004/0027745 A1 * 2/2004 Kunz et al. ............... 361/56
2005/0006699 A1 * 1/2005 Sato et al. ................ 257/327

FOREIGN PATENT DOCUMENTS

| JP | 7-240520 | 9/1995 |
| JP | 3400237 | 2/2003 |
| JP | 3450650 | 7/2003 |
| JP | 2004-247751 | 9/2004 |

OTHER PUBLICATIONS

M. Kudoh, et al., "Current Sensing IGBT Structure with Improved Accuracy", Proceedings of 1995 International Symposium on Power Semiconductor Devices & ICs, Yokohama, May 23, 1995, pp. 119-122.
Stephen P. Robb, et al., "Current Sensing in IGBTs for Short-Circuit Protection", Proc. of the 6$^{th}$ Internat. Symposium on Power Semiconductor Devices & IC's, Davos, Switzerland, May 31-Jun. 2, 1994, pp. 81-85.

* cited by examiner

*Primary Examiner*—Long K Tran
(74) *Attorney, Agent, or Firm*—Oblon, Spivak, McClelland, Maier & Neustadt, P.C.

(57) ABSTRACT

A semiconductor device comprises a semiconductor portion including first semiconductor layers of a first conduction type and second semiconductor layers of a second conduction type alternately arranged on the surface of a semiconductor substrate to form a striped shape. A main region is formed to arrange a main cell in a well. A current sense cell is arranged in a sense well. A sense region is formed having the direction of the length in a direction that intersects the direction of alternate arrangement of the first semiconductor layers and the second semiconductor layers.

14 Claims, 9 Drawing Sheets

SEMICONDUCTOR DEVICE

CROSS REFERENCE TO RELATED APPLICATION

This application is based on and claims the benefit of priority from prior Japanese Patent Application No. 2005-178837, filed on Jun. 20, 2005, the entire contents of which are incorporated herein by reference.

BACKGROUND OF THE INVENTION

1. Field of the Invention

The present invention relates to a semiconductor device including current sense cells.

2. Description of the Related Art

Power devices typically include a power MOSFET (Metal Oxide Semiconductor Field Effect Transistor) and an IGBT (Insulate Gate Bipolar Transistor). When excess current caused by short-circuit or the like flows in such the power device, it breaks down the power device. Accordingly, it is required to control excess current not to flow in the power device. When a power device is employed to control the rotation of a motor, it is required to control current flowing in the power device precisely. For these purposes, a current sensor is provided separately from the power device. In general, a resistor is connected between the power device and the current sensor to sense a potential between both for current sensing.

When a current sense cell, or the current sensor, is formed on a single chip together with the power device (main cell), external components such as a current probe are not required and the device can be downsized. See JP-A 7-240520 (FIG. 1), JP Patent No. 3400237 (FIGS. 1-3, 6-8), and JP Patent No. 3450650 (FIGS. 1-4, 7, 8). In this case, however, no potential locates across the current sense cell and the main cell if the current sense cell is isolated from the main cell, and no current can be sensed. On the other hand, it is required to ensure the area of a region (sense region) formed to arrange the current sense cell therein.

SUMMARY OF THE INVENTION

In one aspect the present invention provides a semiconductor device, which comprises a semiconductor substrate; a back electrode arranged on the back of the semiconductor substrate; a semiconductor portion including first semiconductor layers of a first conduction type and second semiconductor layers of a second conduction type alternately arranged on the surface of the semiconductor substrate to form a striped shape; a main region formed to arrange a main cell therein, the main cell including a gate electrode, a well of the second conduction type formed on the second semiconductor layer, and a source/emitter layer of the first conduction type formed in the well; a sense region formed to arrange a current sense cell therein, the current sense cell including a sense gate electrode, a sense well of the second conduction type formed on the second semiconductor layer, and a sense source/emitter layer of the first conduction type formed in the sense well; a first top electrode arranged above the surface of the semiconductor substrate and connected to the well and the source/emitter layer; a second top electrode arranged above the surface of the semiconductor substrate and connected to the sense well and the sense source/emitter layer; and a ring layer of the second conduction type located on the semiconductor portion, surrounding the main region and the sense region, and connected to the first top electrode.

DETAILED DESCRIPTION OF THE INVENTION

Figure 1:
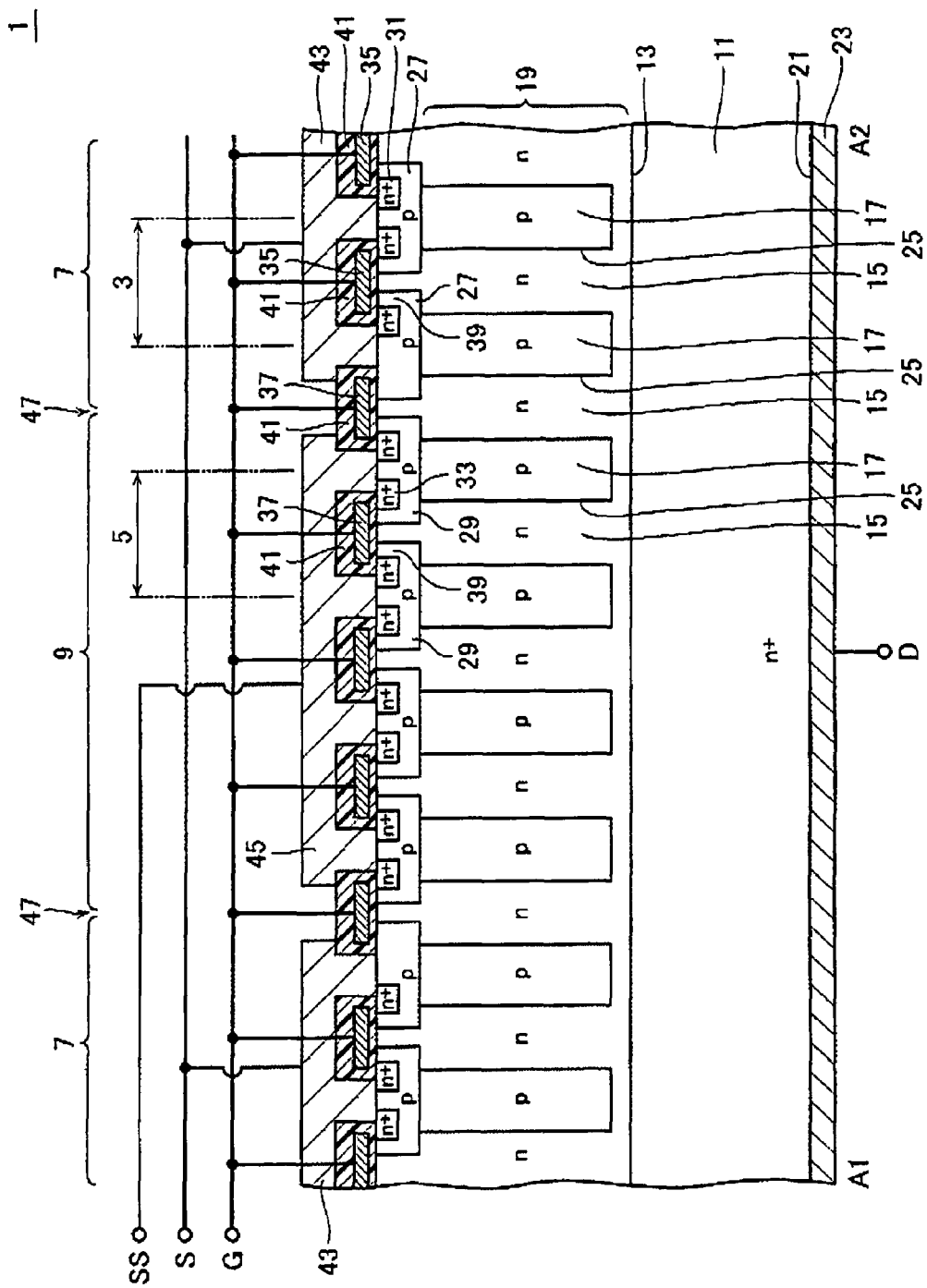
FIG. 1 is a schematic diagram of a section (A1-A2) of a semiconductor device according to a first embodiment.

Embodiments of the present invention will now be described with reference to the drawings. In the figures illustrative of the embodiments, to the parts same as or similar to those denoted with the reference numerals in the figure once described, the same reference numerals are given to avoid duplicate description thereof.

First Embodiment

FIG. 1 is a schematic diagram of a section of a semiconductor device 1 according to a first embodiment. The semiconductor device 1 comprises a number of main cells 3 and a number of current sense cells 5, which are formed on the same chip. These cells are power MOSFETs. A region formed to arrange the main cells 3 therein is referred to as a main region 7 while a region formed to arrange the current sense cells 5 therein is referred to as a sense region 9. A structure of the semiconductor device 1 is described in detail below.

The semiconductor device 1 comprises an $N^+$-type semiconductor substrate (for example, silicon substrate) 11. A single crystal semiconductor portion 19 is formed on the surface 13 thereof, including n-type first semiconductor layers 15 and p-type second semiconductor layers 17 alternately arranged. A back electrode 23 is arranged on the back 21 of the semiconductor device 1. The n-type is an example of the first conduction type, and the p-type is an example of the second conduction type.

The $n^+$-type semiconductor substrate 11 serves as a drain region. Therefore, the back electrode 23 turns into a drain electrode. The first semiconductor layers 15 are formed by providing a plurality of trenches 25 in an n-type single crystal silicon layer arranged on the surface 13 of the semiconductor device 1. The first semiconductor layer 15 serves as a drift region. The second semiconductor layers 17 are p-type single crystal silicon layers buried in the trenches 25 by epitaxial growth, respectively.

The first semiconductor layers 15 and the second semiconductor layers 17 are formed in the shape of collars, which configure a superjunction structure. In detail, the n-type first semiconductor layers 15 and the p-type second semiconductor layers 17 are arranged alternately and repeatedly in a direction parallel to the surface 13 of the semiconductor substrate 11. This arrangement is possible to completely deplete these layers 15 and 17 when the semiconductor device 1 is turned off. Such the superjunction structure is effective to achieve a low on-resistance and a high breakdown voltage of the power MOSFET simultaneously.

A p-type well 27 is formed above the second semiconductor layer 17 in the main region 7 while a p-type sense well 29 is formed above the second semiconductor layer 17 in the sense region 9. The well 27 and the sense well 29 are referred to as base regions (or body regions). An n$^+$-type source layer 31 is formed in the well 27 while an n$^+$-type sense source layer 33 is formed in the sense well 29. The source layer 31 is an example of the source/emitter layer. The source/emitter layer has at least one of functions of a source layer and an emitter layer. The sense source layer 33 is an example of the sense source/emitter layer. The sense source/emitter layer has at least one of functions of a sense source layer and a sense emitter layer.

In the main region 7, a gate electrode 35 is formed on a gate insulation film above the first semiconductor layer 15. The gate electrode 35 extends to a location above an end portion of the well 27. On the other hand, in the sense region 9, a sense electrode 37 is formed on a sense gate insulation film above the first semiconductor layer 15. The sense electrode 37 extends to a location above an end portion of the sense well 29. The gate electrode 35 and the sense electrode 37 may be composed of polysilicon. The end portion of the well 27 and the end portion of the sense well 29 serve as channel regions 39.

The gate electrode 35 and the sense electrode 37 are covered in respective insulation films 41. The insulation film 41 above the main region 7 is covered in a first top electrode 43. The first top electrode 43 is connected to the well 27 and the source layer 31 and serves as a source electrode. Therefore, the first top electrode 43 is arranged above the surface 13 of the semiconductor substrate 11 and serves as a path of the current that flows in the main cell 3.

In the sense region 9, a second top electrode 45 is arranged to cover the insulation film 41 and connected to the sense well 29 and the sense source layer 33. The second top electrode 45 is arranged above the surface 13 of the semiconductor substrate 11 and serves as a path of the current that flows in the current sense cell 5.

One main cell 3 (current sense cell 5) comprises one first semiconductor layer 15, halves of the second semiconductor layers 17 located at both sides thereof, and others such as the well 27 (sense well 29), the source layer 31 (sense source layer 33), and the gate electrode 35 (sense gate electrode 37) arranged at locations corresponding to these semiconductor layers. In the main region 7, a number of main cells 3 are arranged regularly and connected in parallel. Similarly, a number of current sense cells 5 connected in parallel are arranged regularly.

On a boundary 47 between the main region 7 and the sense region 9, the main cell 3 and the current sense cell 5 are arranged by respective halves. In this boundary section, the main cell 3 includes no source layer 31 formed therein and accordingly can not work. Therefore, the boundary 47 isolates the main cell 3 from the current sense cell 5 for the following reason. When the current from the main cell 3 flows in the current sense cell, or when the current from the current sense cell 5 flows in the main cell, the potential across the main cell 3 and the current sense cell 5 disappears and prevents current sensing. In the boundary 47, at least one of the source layer 31 of the main cell 3, a sense source layer 33 of the current sense cell 5, and the sense gate electrode 37 formed therein may be omitted. Even in that case, the main cell 3 and the current sense cell 5 can be isolated from each other in the boundary 47, thus obtaining the same advantage.

The main cell 3 and the current sense cell 5 share the back electrode 23 and have a common drain D. The gate electrode 35 and the sense gate electrode 37 are commonly connected, and the main cell 3 and the current sense cell 5 have a common gate G. In contrast, the first top electrode 43 and the second top electrode 45 are not commonly connected. Instead, a source S is connected to the first top electrode 43 while a sense source SS is connected to the second top electrode 45.

Figure 2:
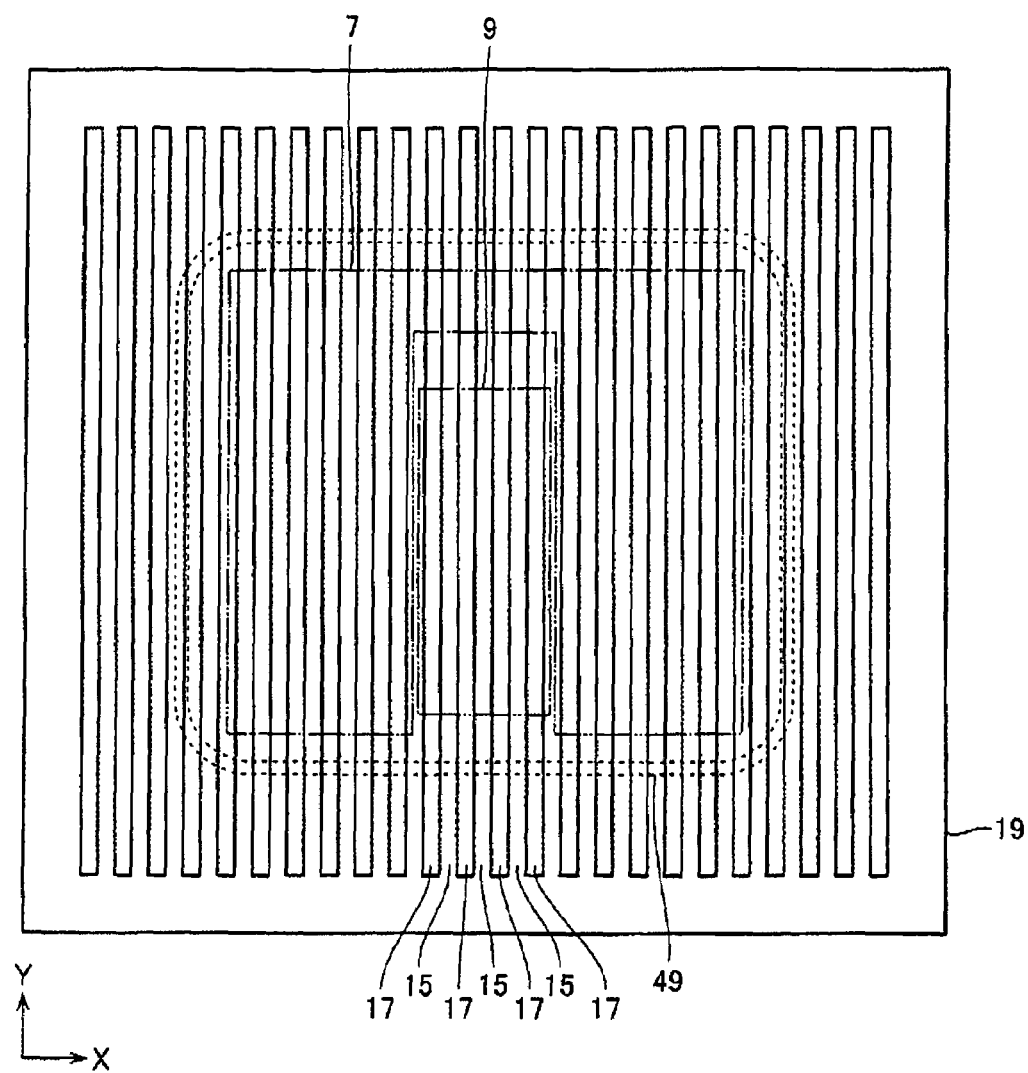
FIG. 2 is a schematic diagram of the whole plane of the semiconductor device according to the first embodiment.
Figure 3:
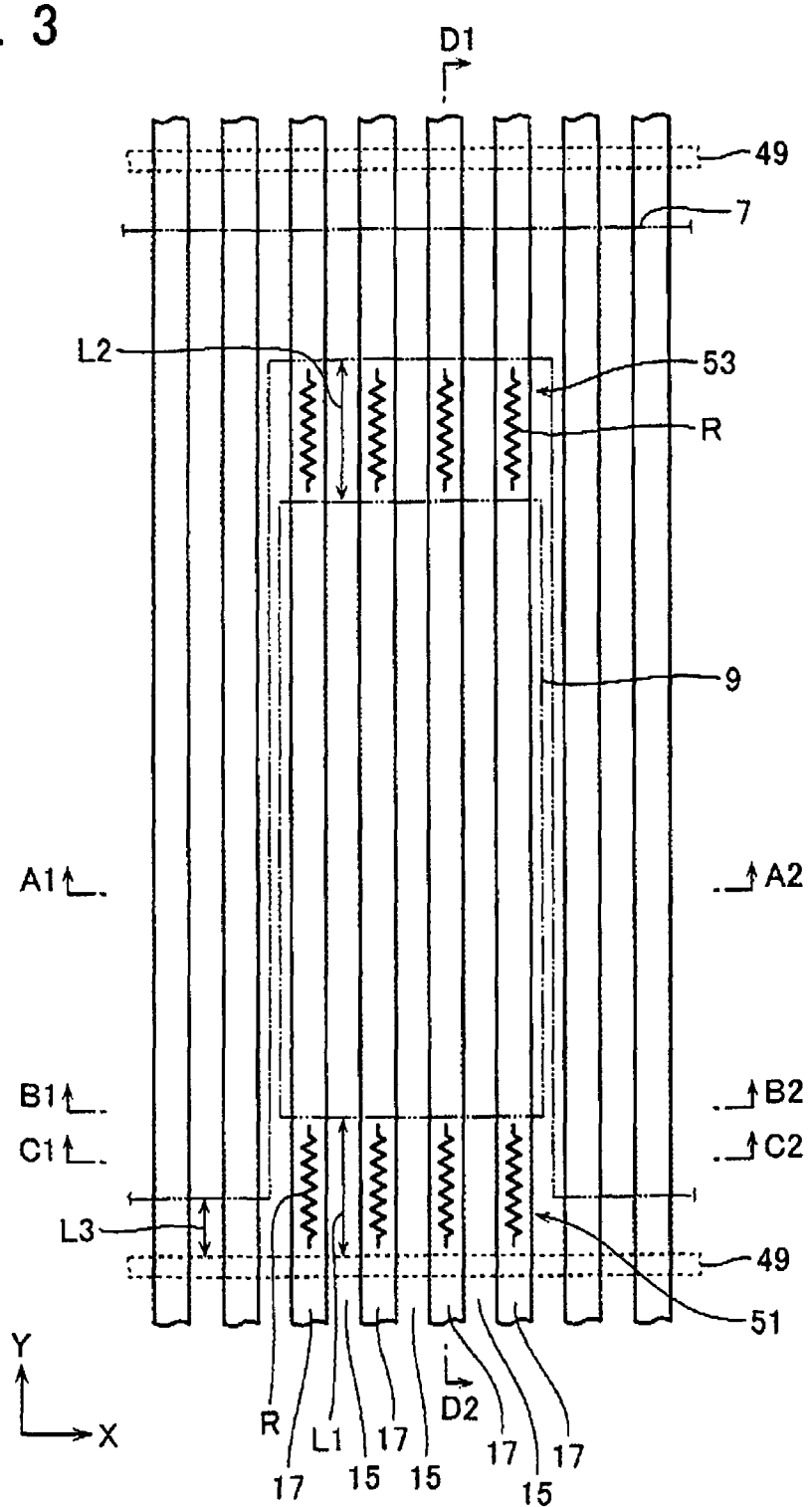
FIG. 3 is a schematic diagram of the plane in the vicinity of a sense region in the semiconductor device according to the first embodiment.

A plane structure of the semiconductor device 1 is described next. FIG. 2 is a schematic diagram of the whole plane of the semiconductor device 1. FIG. 3 is a schematic diagram of the plane in the vicinity of a sense region 9. The schematic diagram of the section taken along A1-A2 line of FIG. 3 is shown in FIG. 1. The portions above the n-type first semiconductor layers 15 and the p-type semiconductor layers 17 are omitted from FIGS. 2 and 3. The n-type first semiconductor layers 15 and the p-type semiconductor layers 17 form a striped plane.

The sense region 9 is arranged on the center of the chip. The plane of the sense region 9 is in the form of a rectangle, which has the direction of the length in the Y-direction that on the single crystal semiconductor portion 19 intersects the X-direction of alternate arrangement of the first semiconductor layers 15 and the second semiconductor layers 17. The main region 7 surrounds three sides of the sense region 9 and is not arranged along one minor side of the sense region 9.

A p$^+$-type ring layer 49 surrounds the main region 7 and the sense region 9 and locates on the single crystal semiconductor portion 19. The ring layer 49 is a p-type impurity-diffused layer. The ring layer 49 is connected to the first top electrode 43 of FIG. 1. Therefore, the ring layer 49 is kept at the same potential as the potential on the source layer 31 in the main cell 3. When a drain voltage (of 600 V, for example) is directly applied to the main region 7 or the sense region 9, the main cell 3 or the current sense cell 5 may be broken down possibly. Therefore, the ring layer 49 is provided to prevent the drain voltage from directly applying to the main region 7 and the sense region 9.

Figure 4:
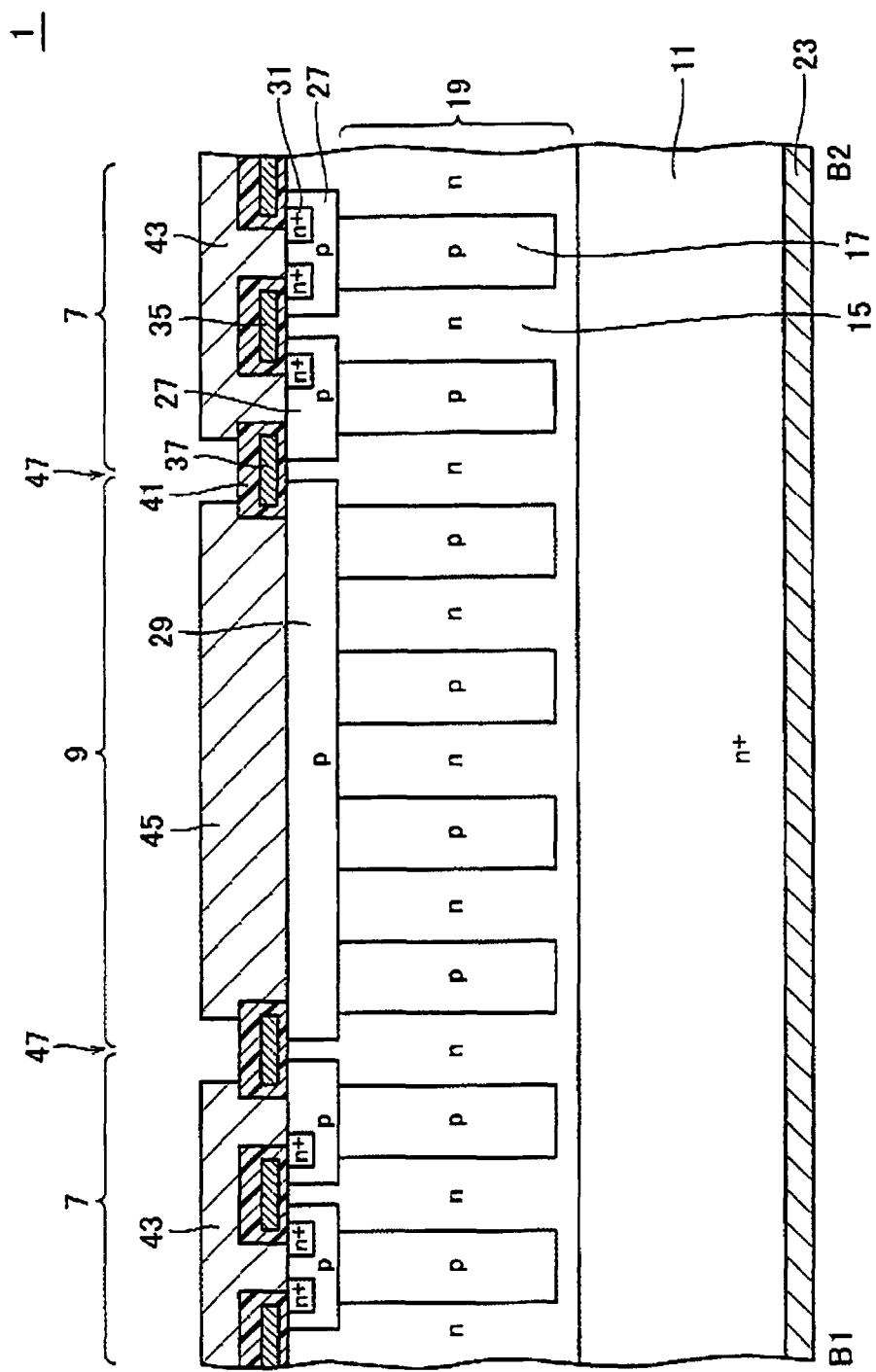
FIG. 4 is a schematic diagram of a section (B1-B2) of the semiconductor device according to the first embodiment.

Other sections than the A1-A2 section shown in FIG. 1 are described next. FIG. 4 is a schematic diagram of a section taken along B1-B2 line in FIG. 3. This section relates to the boundary of the sense region 9 and extends in the X-direction. The sense source layer 33 does not extend to the boundary and the sense source layer 33 is not formed in the sense well 29 in the boundary section. The second top electrode 45 extends to the boundary and is connected to the sense well 29. In contrast, the main region 7 extends closer to the ring layer 49 than the sense region 9 does and accordingly the source layer 31 is formed in the well 27.

Figure 5:
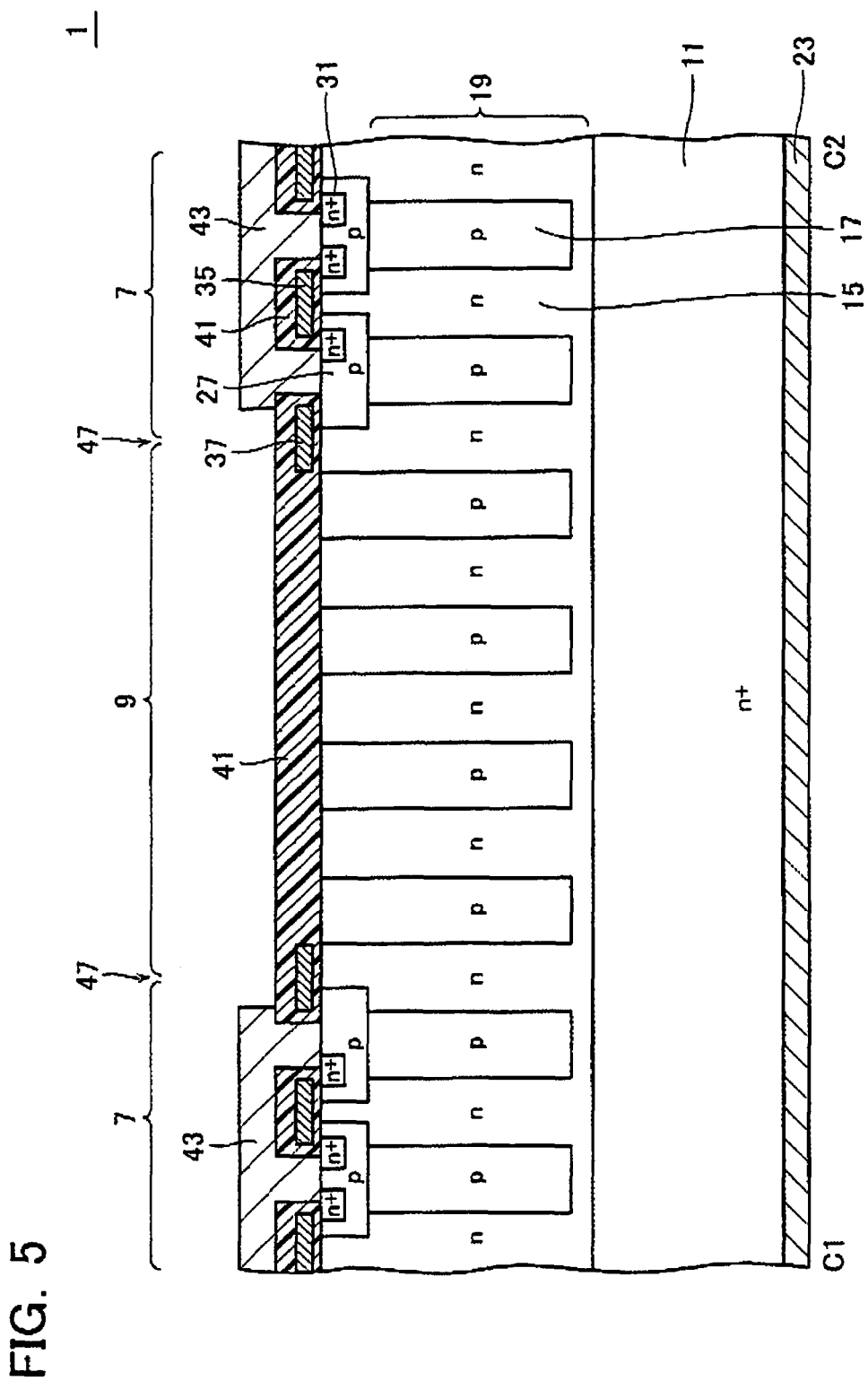
FIG. 5 is a schematic diagram of a section (C1-C2) of the semiconductor device according to the first embodiment.

FIG. 5 is a schematic diagram of a section taken along C1-C2 line in FIG. 3, which is much closer to the ring layer 49 than the section of FIG. 4. In the sense region 9, the sense well 29 is not arranged, neither is the second top electrode 45. The first semiconductor layers 15 and the second semiconductor layers 17 are covered in the insulation films 41. The main region 7 is similar to that in FIG. 4.

Figure 6:
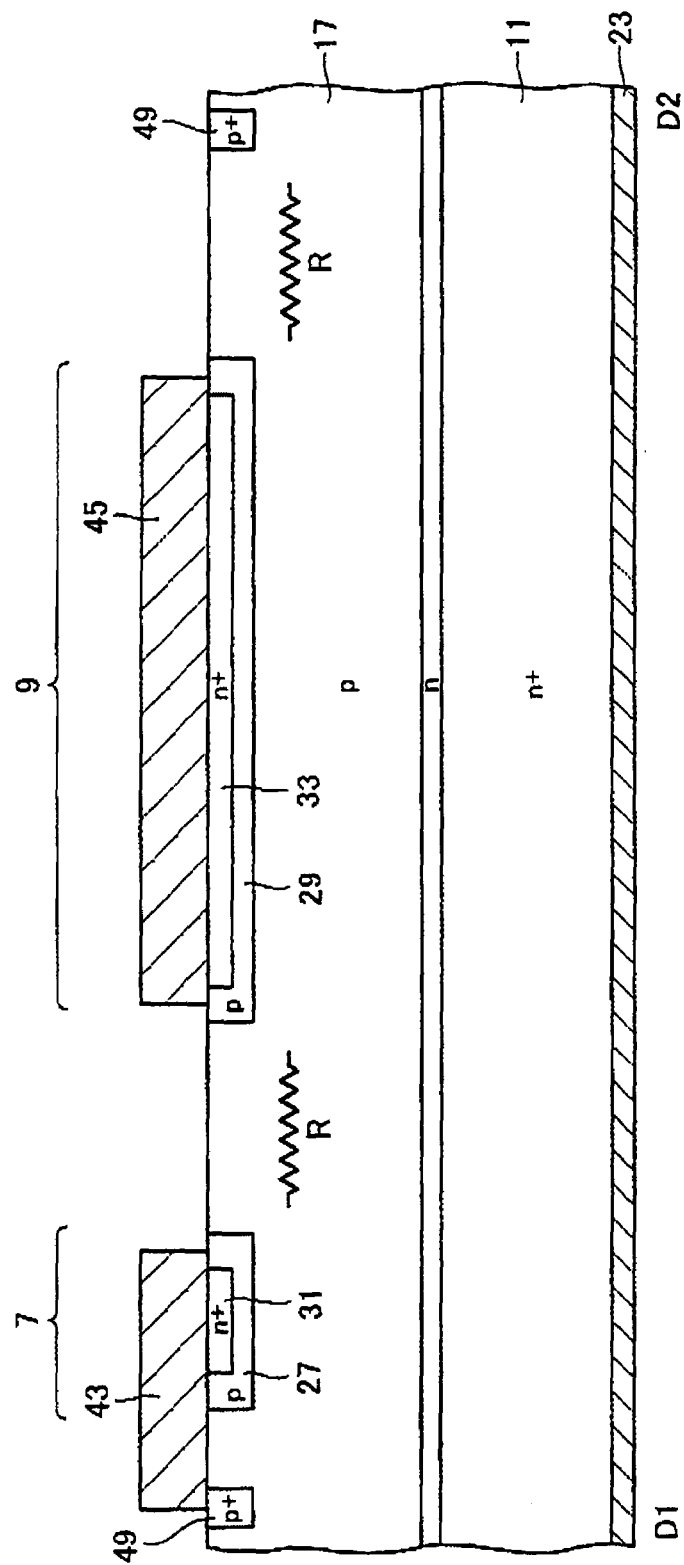
FIG. 6 is a schematic diagram of a section (D1-D2) of the semiconductor device according to the first embodiment.

FIG. 6 is a schematic diagram of a section taken along D1-D2 line in FIG. 3. This figure shows a section of the second semiconductor layer 17 in the main region 7 and the sense region 9. As shown in FIG. 6, the sense well 29 in the sense region 9 is formed on the second semiconductor layer 17 where the well 27 in the main region 7 is formed. The first top electrode 43 is connected to the ring layer 49.

Next, given to operation of the semiconductor device 1 is described with reference to FIG. 1. In operation, the source layer 31 and the well 27 in each main cell 3 are grounded through the source S. Similarly, the sense source layer 33 and the sense well 29 in each current sense cell 5 are grounded through the sense source SS. A certain positive voltage is applied via the back electrode 23 to the semiconductor substrate 11 or the drain region.

In order to turn on the semiconductor device 1, a certain positive voltage is applied via the gate G to the gate electrode 35 in each main cell 3 and to the sense gate electrode 37 in each current sense cell 5. Thus, an n-type inversion layer is formed in the channel region 39. Passing through the inversion layer, electrons from the source layer 31 are injected into the n-type first semiconductor layer 15, and then reach the semiconductor substrate 11 or the drain region. Accordingly, the main current flows from the back electrode 23 through the main cell 3 to the first top electrode 43.

At the same time, the sensing current flows from the back electrode 23 through the current sense cell 5 to the second top electrode 45. A resistor (not shown) is connected in between the source S and the sense source SS to sense current by detecting the potential across the resistor.

In order to turn off the semiconductor device 1, on the other hand, the voltage applied to the gate electrode 35 and the sense gate electrode 37 is controlled as follows. That is, the potential on the gate electrode 35 is made lower than the potential on the source layer 31. In addition, the potential on the sense gate electrode 37 is made lower than the potential on the sense source layer 33. This is effective to eliminate the n-type inversion layer in the channel region 39 to halt the injection of electrons from the source layer 31 and the sense source layer 33 into the n-type first semiconductor layer 15. Therefore, no current can flow from the semiconductor substrate 11 or the drain region into the source layer 31 and the sense source layer 33. At the off time, depletion layers extend laterally from the pn junction formed between the first semiconductor layer 15 and the second semiconductor layer 17. The depletion layers can completely deplete the first semiconductor layer 15 and the second semiconductor layer 17 and retain the breakdown voltage of the semiconductor device 1.

A primary effect of the semiconductor device according to the first embodiment is described next. As a premise for understanding this, a problem derived from a superjunction structure with a striped plane is described. Current sensing requires isolation of the main cell 3 from the current sense cell 5. Therefore, on the boundary 47 between the main region 7 and the sense region 9, the source layer 31 is not formed in the main cell 3, as shown in FIG. 1, to isolate the main cell 3 from the current sense cell 5.

In this case, however, the p-type second semiconductor layer 17 is present. Accordingly, the well 27 and the source layer 31 in the main cell are connected through the p-type second semiconductor layer 17 to the sense well 29 and the sense source layer 33 in the current sense cell as shown in FIG. 6. Therefore, the isolation in this section may possibly become insufficient. Even if the sense region 9 is arranged adjacent to the main region 7 along the X-direction In FIG. 2, the situation is unchanged for the following reason. The $p^+$-type ring layer 49 is inevitably connected to the $p^+$-type second semiconductor layer 17. Accordingly, the well 27 and the source layer 31 in the main cell are connected through the p-type second semiconductor layer 17 and the $p^+$-type ring layer 49 to the sense well 29 and the sense source layer 33 in the current sense cell.

The second semiconductor layer 17 may not be formed in a region 51 between the sense region 9 and the ring layer 49 and in a region 53 between the sense region 9 and the main region 7. In this case, it is possible to isolate the main cell 3 from the current sense cell 5. This arrangement, however, does not keep the superjunction structure to be a simple pattern. This worsens the yield of the semiconductor device 1 and lowers the breakdown voltage.

Figure 7:
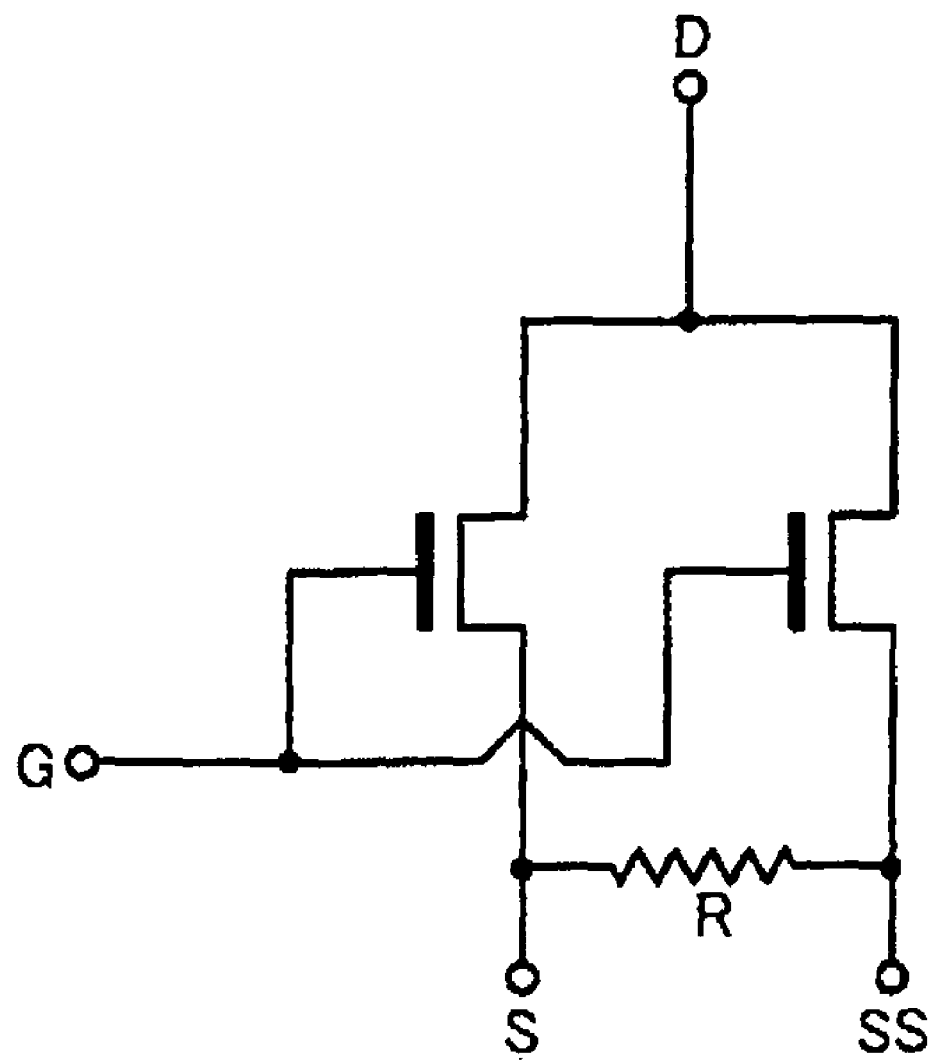
FIG. 7 is an equivalent circuit diagram of the semiconductor device according to the first embodiment.

A reduced number of the second semiconductor layers 17 in the region 51, 53 increases the resistance R of the region 51, 53 such that it can isolate the main cell 3 from the current sense cell 5. FIG. 7 is an equivalent circuit diagram of the semiconductor device including the resistance R. On the other hand, it is also required to ensure the area of the sense region 9. Therefore, in the first embodiment, the sense region 9 is designed to have a plane in the form of a rectangle. This rectangle has the direction of the length in the Y-direction, which on the single crystal semiconductor portion intersects the X-direction of alternate arrangement of the first semiconductor layers 15 and the second semiconductor layers 17. This is effective to increase the resistance in the region 51, 53 (that is, isolate the main cell 3 from the current sense cell 5) and ensure the area of the sense region 9.

A longer length of the second semiconductor 17 in the region 51, 53 can increase the resistance R. Therefore, in the first embodiment, a distance L1 between the sense region 9 and the ring layer 49 and a distance L2 between the sense region 9 and the main region 7 are made longer than a distance L3 between the main region 7 and the ring layer 49 to increase the resistance R.

In the first embodiment, the sense region 9 is arranged on the center of the chip of the semiconductor device 1 as shown in FIG. 2. This is effective as described below. No current can flow uniformly throughout the whole chip. Accordingly, an inappropriate location of the sense region 9 prevents correct sensing of the current. As the sense region 9 is arranged on the center of the chip, the sense region 9 locates near each main cell 3 arranged in the main region 7. Therefore, the current sensing accuracy can be improved.

In the first embodiment, the main region 7 surrounds three sides of the sense region 9. Therefore, wire bonding to the second top electrode 45 in the sense region 9 can be applied from the side where the main region 7 is not arranged. Accordingly, wire bonding to the second top electrode 45 can be implemented easily.

Figure 8:
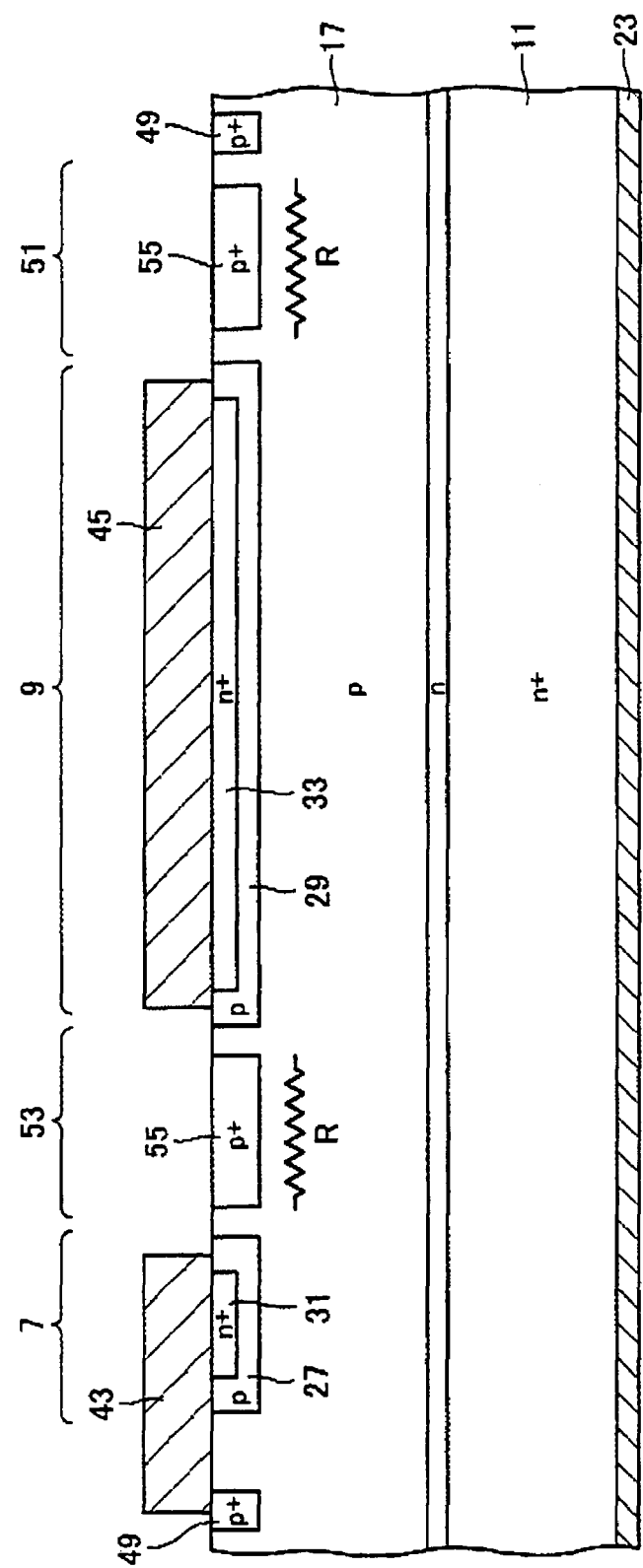
FIG. 8 is a schematic diagram of a section of a modification of the semiconductor device according to the first embodiment.

A modification of the first embodiment is described next. FIG. 8 is a cross-sectional view, which shows the modification and corresponding to FIG. 6. A third semiconductor layer 55 is arranged in the p-type second semiconductor layer 17 in the region 51 (between the sense region 9 and the ring layer 49) and the region 53 (between the sense region 9 and the main region 7). The third semiconductor layer 55 has a higher p-type impurity concentration than the second semiconductor layer 17. When the second semiconductor layer 17 is depleted, the resistance R has a greatly elevated value and may possibly lower the current sensing accuracy. In the modification, the third semiconductor layer 55 is arranged to decrease the variation in the value of the resistance R, resulting in an improved current sensing accuracy.

Second Embodiment

Figure 9:
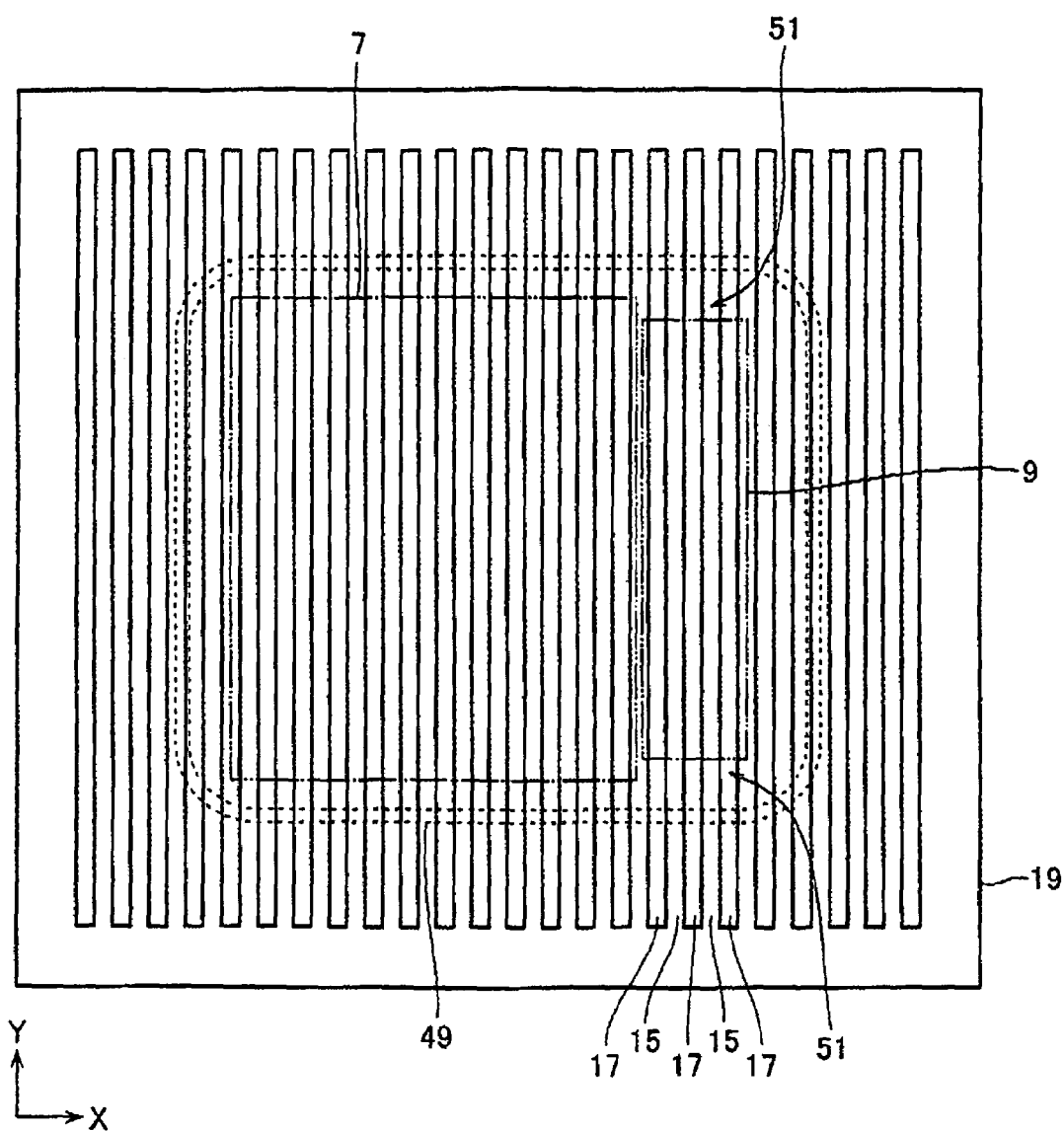
FIG. 9 is a schematic diagram of the whole plane of a semiconductor device according to a second embodiment.

FIG. 9 is a schematic diagram, which shows the whole plane of a semiconductor device 61 according to a second embodiment and corresponds to FIG. 2. The main region 7 locates on the one side in the X-direction of alternate arrangement of the first semiconductor layers 15 and the second semiconductor layers 17 while the sense region 9 locates on the other side in the X-direction.

A reduced number of the second semiconductor layers 17 arranged in the region 51 between the sense region 9 and the ring layer 49 increases the resistance R to isolate the main cell from the current sense cell more reliably. Therefore, in the second embodiment, the number of the second semiconductor layers 17 arranged in the region 51 is determined equal to three, which is less than four in the first embodiment shown in FIG. 2.

On the other hand, in the second embodiment, to ensure the area of the sense region 9, the dimension in the direction of the length of the sense region 9 should be made much larger. In this case, if the sense region 9 is arranged on the center of the chip, the main region 7 is divided into two portions. Accordingly, it is required to apply wire bonding to the source layer in each of these portions. In the second embodiment, the main region 7 locates on the one side in the X-direction while the sense region 9 locates on the other side in the X-direction. This is effective to extend the dimension in the direction of the length of the sense region 9 without dividing the main region 7 into two portions.

The semiconductor devices according to the first and second embodiments are exemplified as the power MOSFET though the present invention is also applicable to the IGBT. In the case of the IGBT, in between the back electrode 23 and the semiconductor substrate 11 in the structure shown in FIG. 1, a p$^+$-type semiconductor layer is added to serve as a collector region. In this case, the source layer 31 and the sense source layer 33 serve as an emitter layer and a sense emitter layer, respectively.

What is claimed is:

1. A semiconductor device, comprising;
   a semiconductor substrate;
   a back electrode arranged on the back of said semiconductor substrate;
   a semiconductor portion including first semiconductor layers of a first conduction type and second semiconductor layers of a second conduction type alternately arranged on the surface of said semiconductor substrate to form a striped shape;
   a main region formed to arrange a main cell therein, said main cell including a gate electrode, a well of the second conduction type formed on said second semiconductor layer, and a source/emitter layer of the first conduction type formed in said well;
   a sense region formed to arrange a current sense cell therein, said current sense cell including a sense gate electrode, a sense well of the second conduction type formed on said second semiconductor layer, and a sense source/emitter layer of the first conduction type formed in said sense well;
   a first top electrode arranged above the surface of said semiconductor substrate and connected to said well and said source/emitter layer;
   a second top electrode arranged above the surface of said semiconductor substrate and connected to said sense well and said sense source/emitter layer; and
   a ring layer of the second conduction type located on said semiconductor portion, surrounding said main region and said sense region, and connected to said first top electrode.

2. The semiconductor device according to claim 1, wherein said main cell and said current sense cell share said back electrode, wherein said gate electrode and said sense gate electrode are commonly connected, wherein said first top electrode and said second top electrode are not commonly connected but connected to individual source-emitter terminals, respectively.

3. The semiconductor device according to claim 1, wherein said second semiconductor layers are also formed in a region between said sense region and said ring layer, and in a region between said sense region and said main region.

4. The semiconductor device according to claim 1, wherein a boundary region between said sense region and said main region is not provided at least one of said source/emitter layer of the main cell, said sense source/emitter layer of the current sense cell, and the sense gate electrode formed therein.

5. The semiconductor device according to claim 1, wherein said main region surrounds three sides of said sense region.

6. The semiconductor device according to claim 1, wherein said sense region is in the form of a rectangle, said rectangle having the direction of the length in a direction that intersects the direction of alternate arrangement of said first semiconductor layers and said second semiconductor layers.

7. The semiconductor device according to claim 6, wherein said main region surrounds said sense region from three sides including two major sides and one minor side of said rectangle of said sense region, and wherein said main region is not arranged along the remaining one minor side.

8. The semiconductor device according to claim 1, further comprising a region in a boundary section of said sense region opposing said ring layer, in which only said sense well is formed and said sense source/emitter layer is not formed.

9. The semiconductor device according to claim 1, wherein said sense region is formed on the center of the device.

10. The semiconductor device according to claim 1, wherein said main region locates on the one side in the direction of alternate arrangement of said first semiconductor layers and said second semiconductor layers, and
    wherein said sense region locates on the other side in the direction of alternate arrangement of said first semiconductor layers and said second semiconductor layers.

11. The semiconductor device according to claim 1, wherein a distance between said sense region and said ring layer is larger than the distance between said main region and said ring layer.

12. The semiconductor device according to claim 1, wherein further comprising a third semiconductor layer arranged in said second semiconductor layer between said sense region and said ring layer and having a higher impurity concentration of the second conduction type than said second semiconductor layer.

13. The semiconductor device according to claim 1, wherein further comprising a semiconductor layer of the second conduction type formed in between said semiconductor substrate and said back electrode and serving as a collector region.

14. The semiconductor device according to claim 1, wherein said sense well in said sense region is formed on said second semiconductor layer where said well in said main region is formed.

* * * * *